United States Patent [19]

Veerhoek et al.

[11] Patent Number: 5,057,841
[45] Date of Patent: Oct. 15, 1991

[54] ANALOG-TO-DIGITAL CONVERTER

[75] Inventors: Jacob J. Veerhoek; Adrianus J. M. Van Tuijl; Han M. Schuurmans, all of Nijmegen, Netherlands

[73] Assignee: U.S. Philips Corporation, New York, N.Y.

[21] Appl. No.: 548,347

[22] Filed: Jun. 29, 1990

[30] Foreign Application Priority Data

Jul. 7, 1989 [NL] Netherlands .......................... 8901740

[51] Int. Cl.[5] .......................... H03M 1/36; H03M 1/38
[52] U.S. Cl. .................................... 341/156; 341/159; 341/163; 341/161
[58] Field of Search ................ 341/155, 159, 161, 163, 341/165, 156

[56] References Cited

U.S. PATENT DOCUMENTS

| | | | |
|---|---|---|---|
| 3,646,586 | 2/1972 | Kurz | 341/163 X |
| 3,956,746 | 5/1976 | Lisle, Jr. et al. | 341/163 X |
| 4,649,371 | 3/1987 | Kolluri | 341/159 |
| 4,907,002 | 3/1990 | Kawada | 341/155 X |

OTHER PUBLICATIONS

Brovkov, V. "12 Bit Analog Digital Umsetzer Mit Stufen-Paralleler Verarbeitung", Nachrichtentechnik Elektronik, vol. 33, No. 1, 1983 (Berlijn, DE).

Primary Examiner—A. D. Pellinen
Assistant Examiner—Sharon D. Logan
Attorney, Agent, or Firm—Bernard Franzblau

[57] ABSTRACT

A successive approximation analog-to-digital converter whose susceptibility to errors is reduced by the use of overlapping measurement ranges in the successive conversion steps.

14 Claims, 7 Drawing Sheets

ANALOG-TO-DIGITAL CONVERTER

BACKGROUND OF THE INVENTION

This invention relates to an analog-to-digital converter for converting an analog input signal into a digital output signal in a series of successive conversion steps, comprising
- comparison means for comparing in a plurality of conversion steps the analog input signal with at least two reference signals defining at least three sub-ranges of a fraction of an input-signal range,
- output means for generating the digital output signal on the basis of comparison signals generated by the comparison means in the successive conversion steps.

Such an analog-to-digital converter is of the successive-approximation type (SA), in which the analog input signal is converted into the digital output signal in a series of successive conversion steps. In each conversion step the value of one bit of the output signal is determined, starting with the most significant bit (MSB), in that each time one bit of a successive approximation register (SAR), whose bits have been reset to zero when conversion begins, is set to one, the digital value in the register being converted into an analog reference signal via a digital-to-analog converter (DAC), and the analog input then is compared with said reference signal with the aid of comparison means in the form of a comparator. The comparator generates a comparison signal on the basis of which a decision is taken either to maintain the relevant bit in the SAR as a one or to reset it to zero. Upon termination of the conversion steps the content of the SAR corresponds to the digital output signal. In each subsequent conversion step in these successive-approximation converters, a fraction of the input signal range is selected which is equal to half the fraction of the preceding conversion step. The reference voltage divides the fraction into two equal sub-ranges. By means of the comparison signal the comparator then indicates in which sub-range the input signal is situated. This sub-range becomes the new fraction for the next conversion step.

It is also possible to determine a plurality of bits at a time in every conversion step. EP 0,153,778 which corresponds to U.S. Pat. No. 4,649,371 (3/10/87) discloses a successive-approximation analog-to-digital converter which determines 2 bits at a time in every conversion step. The comparison means then comprise a 2-bit parallel analog-to-digital converter having three comparators and in every conversion step a fraction of the input signal range is divided into four equal sub-ranges. The comparators in the parallel converter decide in which sub-range the input signal is situated and indicate this by means of a 2-bit comparison signal on the basis of which the values of the 2 bits of the SAR, and hence those of the output signal, are defined. Moreover, the sub-range thus found is selected as the new fraction for the next conversion step.

A drawback of the prior-art successive-approximation converters is that an erroneous decision irrevocably results in an erroneous bit being stored in the SAR, so that a wrong output signal is supplied. A first cause of incorrect decisions may be that the comparator is too slow. Within every conversion step a specific window is available within which the comparator is given the opportunity to form an output signal on the basis of which a decision is taken. In every conversion step the output signal of the comparator will change to one of two extreme values and thus pass a decision threshold, depending on the difference between the input signal and the reference signal. A difference equal to half a quantisation step should already cause the output signal to pass the decision threshold so far that an accuracy corresponding to half the least significant bit (LSB) is obtained. The output signal of a slow comparator cannot track the changes in the differences rapidly enough, so that the decision threshold is not passed in due time and erroneous decisions are taken. In particular, if the analog input signal has a value corresponding to approximately the MSB, the comparator should be capable of responding rapidly and accurately, immediately after the largest possible variation of the reference signal.

Another cause of erroneous decisions may be due to the presence of noise on the analog input signal, on the reference signal and in the comparator. Since the comparator should have a wide frequency pass band to enable it to respond rapidly, the noise in this frequency band will also affect the decision accuracy. Although, in particular, the comparator(s) used constitute an important error source, other components of the successive approximation converter may also give rise to an incorrect decision. For example, the DAC which generates the reference voltages also has a certain response time to changes at its digital input. Even components whose operation is purely digital, such as the SAR, may constitute an error source if the conversion speed is higher than a certain value.

SUMMARY OF THE INVENTION

It is an object of the invention to provide a successive-approximation analog-to-digital converter which is less susceptible to erroneous decisions.

To this end, an analog-to-digital converter of the type defined in the opening paragraph is characterized in that the analog-to-digital converter further comprises:
- generator means for generating, on the basis of the comparison signal generated in a conversion step, new reference signals for the next conversion step, the new reference signals defining a new fraction of the input signal range for the next conversion step, which new fraction overlaps one of the sub-ranges of the relevant conversion step.

The new reference signals for the next conversion step define a new fraction which, in contradistinction to that in the prior-art converters, is not equal to one of the sub-ranges of the conversion step which is in progress, but which overlaps one of the sub-ranges thereof. The overlap enables an erroneous decision to be corrected in a subsequent conversion step. For example, if, as a result of noise or an inadequate speed a comparator makes a decision error which corresponds to an analog signal value within the range of overlap, the signal value will be included in the new fraction in the next conversion step. The analog-to-digital converter in accordance with the invention has error correcting capabilities so that the influence of erroneous decisions on the resulting digital output signal is reduced substantially. Therefore, the converter in accordance with the invention allows the use of slower and hence less noise-sensitive components, in particular comparators, without the accuracy being degraded. On the other hand, it is possible to realise a more accurate analog-to-digital converter using the same components.

In contrast with the prior-art successive-approximation analog-to-digital converter, in which the reference signals are the analog representatives of the digital output signal so far successively approximated in the SAR, the digital representatives of the reference signals in the converter in accordance with the invention deviate therefrom as a result of the overlap. An embodiment of an analog-to-digital converter in accordance with the invention, in which the generator means are adapted to supply the digital representatives of both the reference signals and the output signal approximated so far, may be characterized in that the generator means comprise

- first storage means for the storage of a fraction signal corresponding to the magnitude of the fraction,
- second storage means for the storage of a level signal which is related to the fraction,
- conversion means for converting the fraction signal and the level signal into the reference signals, and
- adaptation means for adapting the fraction signal and the level signal to the next conversion step on the basis of the comparison signal of the relevant conversion step.

The level signal in the second storage means is the digital representation of the digital output signal approximated so far in successive conversion steps. The fraction signal in the first storage means is combined with the level signal and is converted into the desired reference signal by the conversion means. The adaptation means do not adapt the digital representatives of the reference signals but the constituent components thereof, i.e. the level signal and the fraction signal. This set-up provides a simple construction of the generator means.

Adaptation of the fraction signal and the level signal to every subsequent conversion step can be effected in several ways. To this end a suitable embodiment of an analog-to-digital converter is characterized in that the adaptation means comprise

- first supply means for supplying to the first storage means, upon completion of a conversion step, a fraction signal multiplied by an adaptation factor,
- second supply means for supplying to the second storage means, upon completion of the conversion step, the sum of the level signal and the product of the fraction signal and the comparison signal multiplied by a weighting factor.

In every conversion step the fraction signal and the level signal are adapted to the next step by means of a similar operation. The selected operations can be realised simply in digital technology.

Generating the at least two reference signals within a conversion step can be effected simultaneously (parallel) or sequentially (serially). In the last-mentioned case intermediate steps are required within the conversion step. A first further embodiment of an analog-to-digital converter in accordance with the invention operating in accordance with the parallel concept is characterized in that the conversion means comprise:

- a first and a second digital-to-analog converter for converting the fraction signal and the level signal into an analog window signal and an analog shift signal respectively, and in that the comparison means comprise
- a parallel analog-to-digital converter for converting a range of the analog input signal, which range is defined by the window signal and the shift signal, into the comparison signal.

The parallel converter now determines in which of the sub-ranges in the fraction the value of the analog input signal is situated and indicates this by means of a digital comparison signal. This concept requires the use of two digital-to-analog converters to enable the digital fraction signal and the level signal to be converted simultaneously into reference signals suitable for the parallel converter.

A second further embodiment of an analog-to-digital converter in accordance with the invention operating in accordance with the serial concept is characterized in that the conversion means comprise

- multiplication means for multiplying the fraction signal by a coefficient to generate a product signal in a predetermined number of successive intermediate steps during the conversion step,
- adding means for forming the sum of the level signal and the product signal so as to obtain a sum signal, and
- a digital-to-analog converter for converting the sum signal into the reference signal, and in that the comparison means comprise
- a comparator for comparing the analog input signal with the reference signal,
- third storage means for the storage of the successive values of a decision signal generated by the comparator in the intermediate steps and decoder means for decoding the values of the decision signal into the comparison signal.

In this case the multiplying and adding means determine a sum signal which has a different value in every intermediate step. The digital-to-analog converter converts the sum signal into a reference signal. The comparison means now comprise only one comparator whose output signal is employed as the decision signal. The values of the decision signal in the successive intermediate steps are stored in the third storage means and are converted into the comparison signal by the decoder means.

BRIEF DESCRIPTION OF THE DRAWINGS

The invention will now be described in more detail, by way of example, with reference to the accompanying drawings, in which.

DESCRIPTION OF THE PREFERRED EMBODIMENTS

Figure 1:
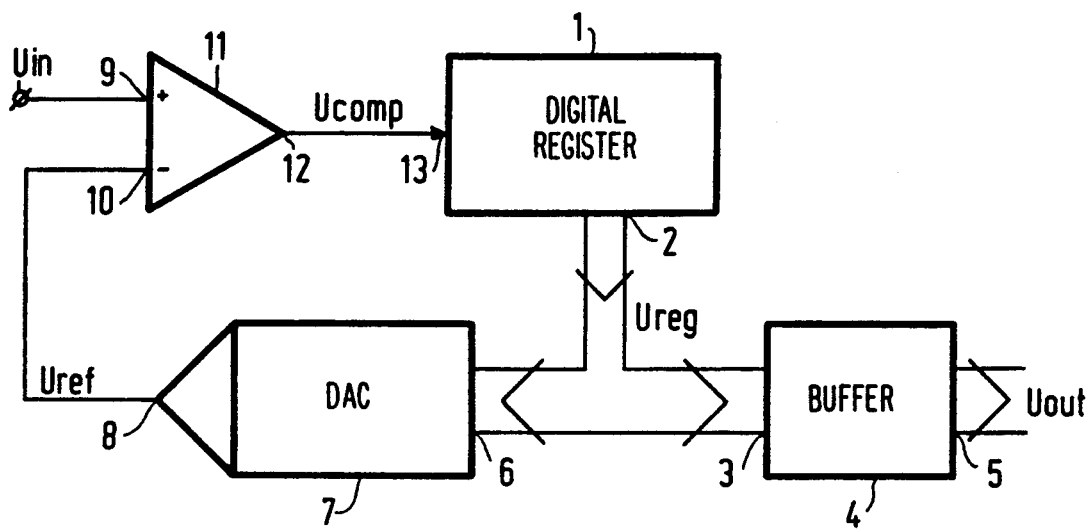
FIGS. 1 and 3 are block diagrams of prior-art analog-to-digital converters.

FIG. 1 is the block diagram of a prior-art successive-approximation analog-to-digital converter (ADC). In this converter the value of an analog input signal to be digitised is determined one bit/step in successive conversion steps. The ADC comprises a digital register 1 whose contents Ureg can be transferred to the inputs 3 and 6 of an output buffer 4 and a digital-to-analog converter (DAC) 7, respectively, via an output 2. The DAC 7 converts the signal Ureg into an analog reference voltage Uref, which is available on the output 8. The analog input signal Uin to be digitised and the analog reference voltage Uref are applied to inputs 9 and 10 respectively of a comparator 11, which amplifies the signal difference at the inputs 9 and 10 to form a comparison signal Ucomp on the output 12. The register 1 has a control input 13 connected to the output 12 of the comparator 11.

When a conversion cycle is started all of the bits of the register 1 are set to "0". Subsequently, in every subsequent conversion step, one bit of the register 1 is provisionally set to "1", starting with the most significant bit (MSB). The reference signal Uref generated by the DAC 7 is compared with the input signal Uin in the comparator 11. If the input signal Uin is larger than the reference signal Uref the comparison signal Ucomp assumes a logic signal value on the basis of which a decision is taken, via the control input 13, to maintain the value "1" for the relevant bit of the register 1 for the remaining conversion steps. In the opposite case, when the input signal Uin is smaller than the reference voltage Uref, it is decided that the bit should be reset to "0" and should subsequently remain "0". The number of conversion steps is equal to the number of bits in the register 1. Upon completion of a conversion process the complete digital output signal is available as Uout on an output 4 of the output buffer 5.

Figure 2:
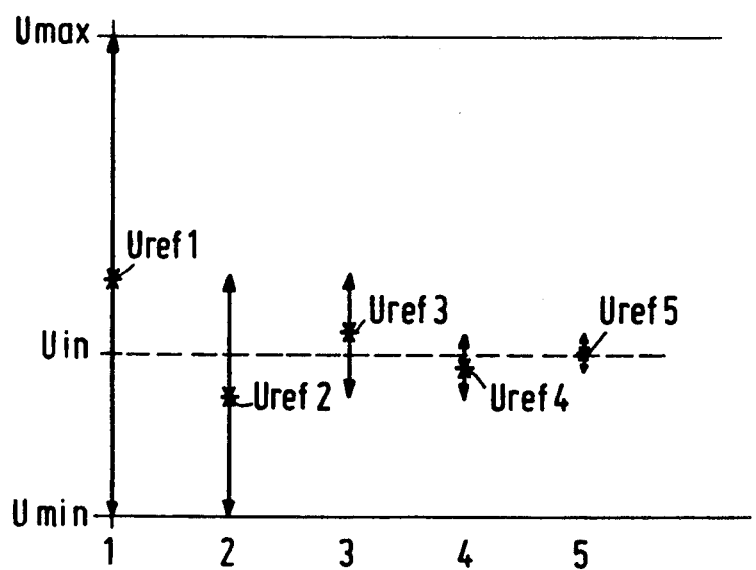
FIGS. 2 and 4 are graphs illustrating the operation of the prior-art converters shown in FIGS. 1 and 3, respectively.

FIG. 2 shows diagrammatically how the successive approximation proceeds for a 5-bit ADC of the type as shown in FIG. 1. In 5 consecutive conversion steps the DAC 7 generates the reference signals Uref1, Uref2, . . . , Uref5. These reference signals divide a continually decreasing fraction, indicated by arrows, of the overall input signal range (Umax-Umin) into two equal sub-ranges. When conversion begins the fraction is equal to Umax-Umin. By means of the comparison signal Ucomp the comparator 11 indicates in which of the two sub-ranges of the relevant fraction the input signal Uin is situated. The indicated sub-range becomes the new fraction for the next conversion step and is again divided by two by the next reference signal. For the value specified for Uin the digital output signal will have the value 01010 upon completion of the 5 conversion steps.

Figure 3:
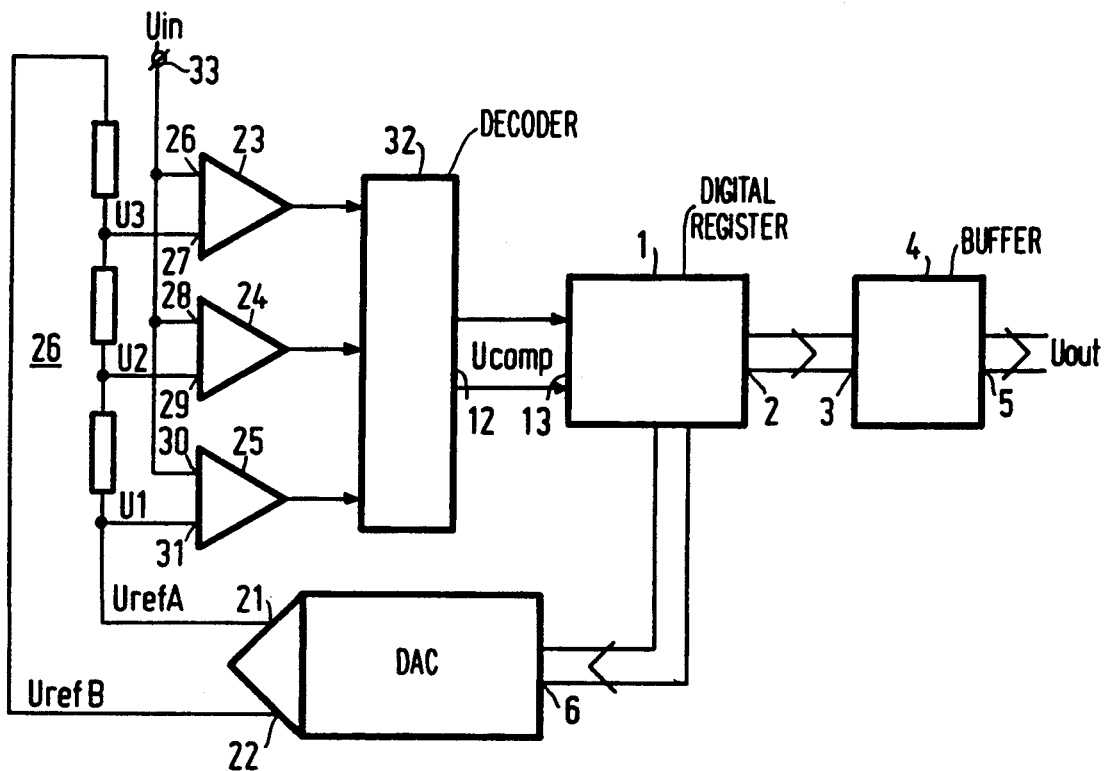
Figure 4:
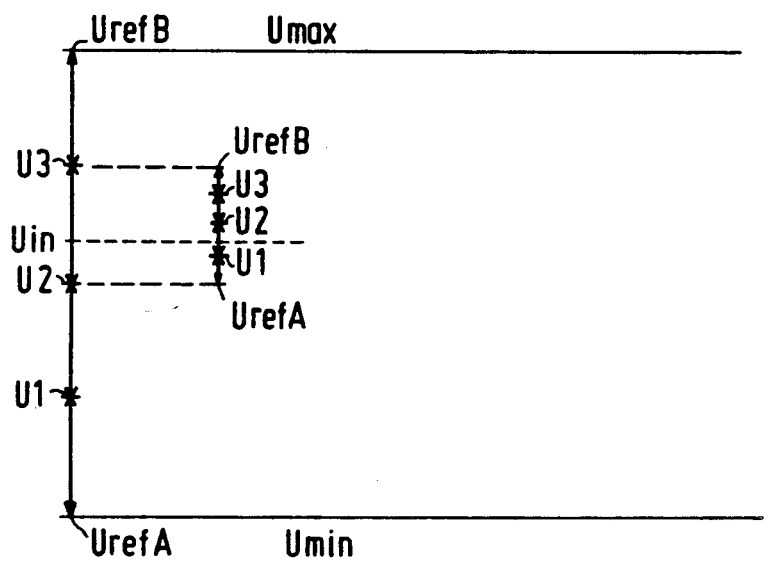

Successive approximation analog-to-digital converters are available which enable a plurality of bits of the output signal to be determined simultaneously in every conversion step. FIG. 3 is a block diagram showing a prior-art ADC in which 2 bits are determined in each conversion step. Parts corresponding to those in FIG. 1 have the same reference numerals. Now the DAC 7 has two analog outputs 21 and 22 for supplying reference signals UrefA, and UrefB respectively, to a reference signal divider 26 of a 2-bit parallel converter, which further comprises three comparators 23, 24, 25 and a decoder 32. The divider 26 has three tappings connected to corresponding first inputs 27, 29 and 31 of the comparators, which have second inputs 26, 28 and 30 connected to an input terminal 33, to which the input signal Uin to be digitised is applied. The signals U1, U2 and U3 at the tappings divide a fraction of the input signal range, defined by the reference signals UrefA and UrefB, into four equal sub-ranges as indicated in FIG. 4. The decoder 32 translates the comparator output signals into a 2-bit comparison signal Ucomp which specifies in which of the four sub-ranges the input signal Uin is situated. On the basis of the comparison signals the relevant 2 bits in the register 1 are adapted (set to "0" or "1") and new reference signals are generated for the next conversion step by the DAC 7. The first two conversion steps are represented diagrammatically in FIG. 4. In the present example the first four bits of the output signal will have the value 1001 after two conversion steps. It will be evident that it is similarly possible to determine 3 or more bits at a time in each conversion step.

The prior-art successive approximation analog-to-digital converters have in common that the decision about the values of the bits in the register 1 and ultimately also of the bits in the output signal is always a one-time and final decision. Erroneous decisions are irrevocable. Such erroneous decisions may be caused by an inadequate speed of the comparators which are used, the DAC or other parts of the converter. Moreover, noise on the input signal and the reference signal and input noise of the comparator may affect the decision accuracy. In particular the requirements imposed on the comparator are comparatively stringent. During each conversion step a specific time interval is available within which the comparator output signal should reach a final value on the basis of which a logic decision about the value of the bit is to be taken. For a correct decision the final value must have passed a specific decision threshold. As a result of an inadequate speed and/or because of noise the comparator output signal may not reach the correct logic decision threshold within the available time interval so that for example, a bit which might have become "1" if enough time had been available is now erroneously set to "0". The number of erroneous decisions caused by an inadequate speed can be reduced by the use of fast components, in particular fast comparators. On the other hand, fast components have a wider frequency pass band resulting in a reduced noise immunity which may give rise to even more incorrect decisions.

In accordance with the invention the susceptibility to incorrect decisions can be reduced by the introduction of overlapping measurement ranges in the successive conversion steps. In contradistinction to the prior-art successive approximation converters, in which every subsequent fraction is exactly equal to one of the sub-ranges of the fraction of the preceding conversion step, the next fraction in converters in accordance with the invention is larger than one of the preceding sub-ranges. As a result of this, the decision as to which of the sub-ranges the input signal is situated can be taken with a specific error margin. The overlap ensures that the error margin is included in the fraction of the next conversion step. Thus, erroneous decisions can be corrected.

Figure 5:
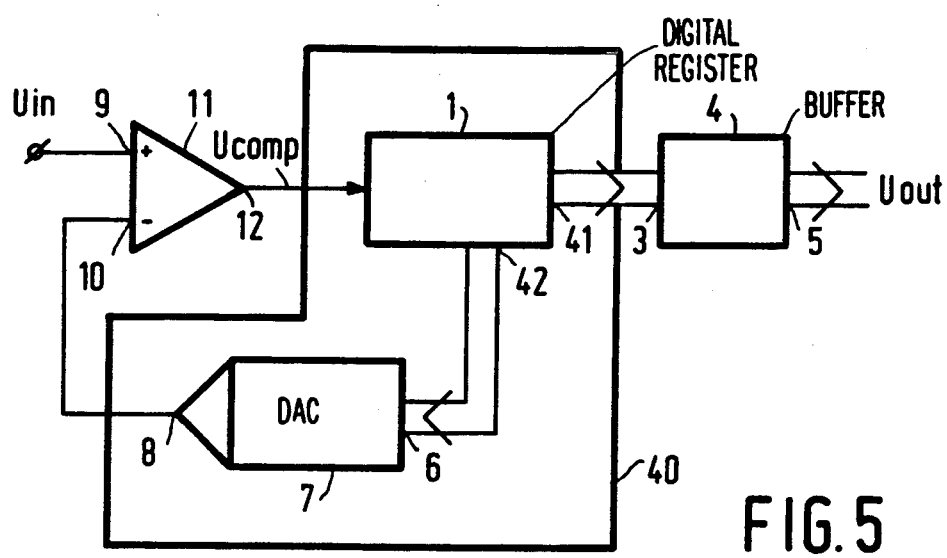
FIG. 5 is a block diagram of an embodiment of an analog-to-digital converter in accordance with the invention.
Figure 6:
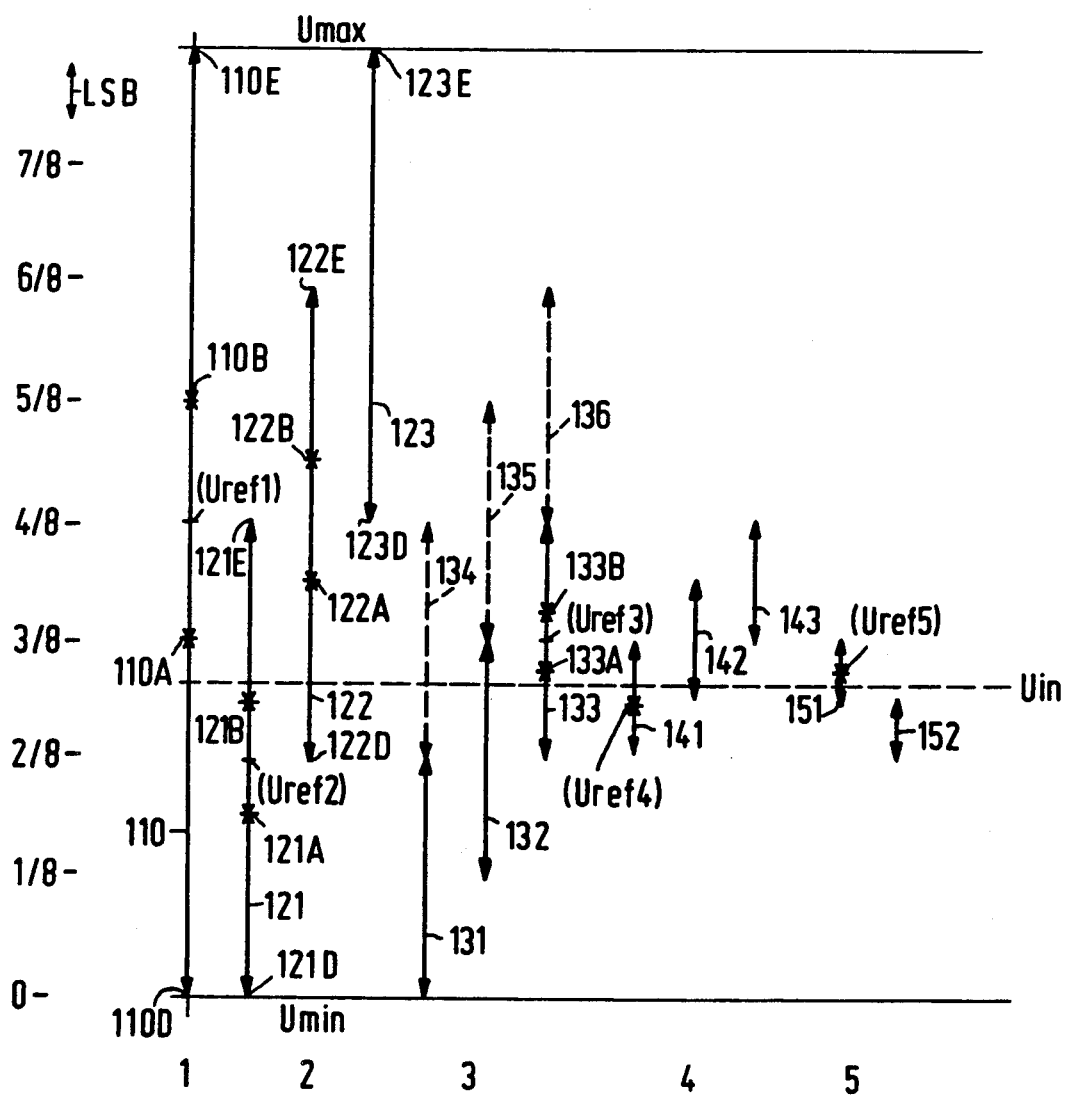
FIGS. 6 and 7 are graphs illustrating the operation of embodiments of analog-to-digital converters in accordance with the invention.

FIG. 5 is a block diagram of an embodiment of a successive-approximation converter in accordance with the invention. The converter is of a type similar to that shown in FIG. 1 and like parts bear the same reference numerals. The register 1 supplies signals to the output buffer 4 and the DAC 7 via outputs 41 and 42, respectively. The register 1 and the DAC 7 form part of generator means 40. FIG. 6, similarly to FIG. 2, shows reference signals, marked with an asterisk (*), on the output 8 of the DAC 7 for the 5 successive conversion steps in the case of a 5-bit output signal. In each conversion step the comparator 11 compares the input signal Uin with two reference signal values. When the first conversion step begins the selected fraction of the input signal range Umax-Umin is equal to the range 110 bounded by the arrows. By way of example the values ⅜ and ⅝ of the fraction 110 are selected as reference signal values and their positions within the fraction 110 are indicated by 110A and 110B. The DAC 7 successively generates the reference values 110A and 110B and by means of two successive output signals Ucomp the comparator 11 indicates in which of the three sub-ranges defined by the reference signals 110A and 110B the fraction of the input signal Uin is situated. If the comparator 11 has determined that Uin is smaller than the reference value 110A, it is assumed in the register 1, on the basis of Ucomp, that Uin is definitely situated in a new fraction 121 which extends from 0 to ½ of the present fraction 110 and which is consequently half the fraction 110. Moreover, the relevant bit, in the present case the most significant bit (MSB), of the output signal 41 is set to "0" and a final decision is taken. This is the case in the example illustrated in FIG. 6 so that MSB="0". If the comparator has ascertained that Uin lies between the reference values 110A and 110B, it would have assumed for the next conversion step that Uin is definitely situated within a new fraction 122 ranging from ¼ to ¾ of the present fraction 110, which is consequently half as large. The decision about the value of the relevant bit for the output signal 41, however, is not taken and is postponed until a subsequent conversion step. This means that now a provisional decision is taken. If the comparator has determined that Uin is larger than the reference value 110B it is assumed in the register 1 that Uin is definitely situated within a new fraction 123 which ranges from ½ to 1/1 of the present fraction 110 and which is again half as large. The relevant bit of the output signal 41 is now set to "1" and again a final decision is taken.

As a result of the two comparisons using the reference values 110A and 110B, three new fractions 121, 122 and 123, which overlap each other, are available from which a choice is made for the next conversion step. The reference values 110A and 110B are spaced at ⅛ of the present fraction from the boundaries of the new fractions 121, 122 and 123. If, for example, as a result of noise or an inadequate speed, the comparator 11 makes a comparison error corresponding to at the most ⅛ of the present fraction a new fraction within which the input signal Uin is situated is nevertheless selected for the next conversion step. The converter then remains locked to the input signal.

In the second conversion step the new fraction, i.e. the fraction 121 in the present example, is again divided into three sub-ranges by two new reference signals 121A and 121B at ⅜ and ⅝ of said new fraction respectively. Again the comparator determines in which of the three sub-ranges the input signal Uin is situated. In the present example Uin is larger than the reference value 121B so that for the fourth conversion step a new fraction 133 is selected which is again half as large as the previous fraction. In the third conversion step the fraction 141 is selected. Starting from the fourth conversion step the DAC 7 in the present example no longer enables the new fraction to be divided by means of reference-signal values at ⅜ and ⅝ of the fraction. This would require steps equal to ⅛ and ¼ of the LSB. Starting from the fourth conversion step, conversion is therefore effected in known manner with only one comparison per step.

If in the first conversion step in the example illustrated in FIG. 6 it is decided erroneously that the input signal is situated between the reference values 110A and 110B instead of below 110A, the range 122 is selected as the new fraction. This fraction is then divided by means of the reference values 122A and 122B and on the basis of a new comparison showing that Uin is smaller than the reference value 122A, the fraction 134 will be selected from the fractions 134, 135 and 136 shown in broken lines. In fact, the fraction 134 corresponds to the fraction 133, so that via a detour, which is possible as a result of the overlapping ranges, the same result is obtained despite the decision error.

In the embodiment shown in FIGS. 5 and 6 described above, the new fractions, for example, 121, 122 and 123, overlap one another equally, i.e. for 50%. Moreover, the fractions are distributed uniformly over the span of the preceding fraction 110. In addition, the centre of the ranges of overlap coincide with the reference values 110A and 110B, which is connected with the choice of the values ⅜ and ⅝. This choice, inter alia, leads to a symmetrical division with equal error margins around the comparison levels. However, any other overlapping division, which may also be different for each conversion step, is possible.

In the converter shown in FIG. 5 the two reference signals are generated serially, i.e. after one another, in two intermediate steps, by the DAC 7 in the generator means 40 on the basis of the comparison signal Ucomp and are compared with the input signal by the comparator 11. It is also possible to generate the two reference signals simultaneously, in which case it is determined in which of the three sub-ranges the input signal Uin is situated, which is effected by means of a suitable parallel converter, for example, of a type as shown in FIG. 3. In this case a 2-bit parallel converter is required, comprising a reference-signal divider having tappings at ⅜ and ⅝ of the full-scale range, 2 comparators and a decoder for conversion of the comparator output signals into a comparison signal which indicates in which of the two sub-ranges the input signal is situated. The reference-signal divider then receives three reference signals which define the boundaries of the relevant fraction. In FIG. 6 these boundaries are 110D/110E for the first conversion step and 121D/121E, 122D/122E and 123D/123E for each of the possible fractions of the second conversion step.

Figure 7:
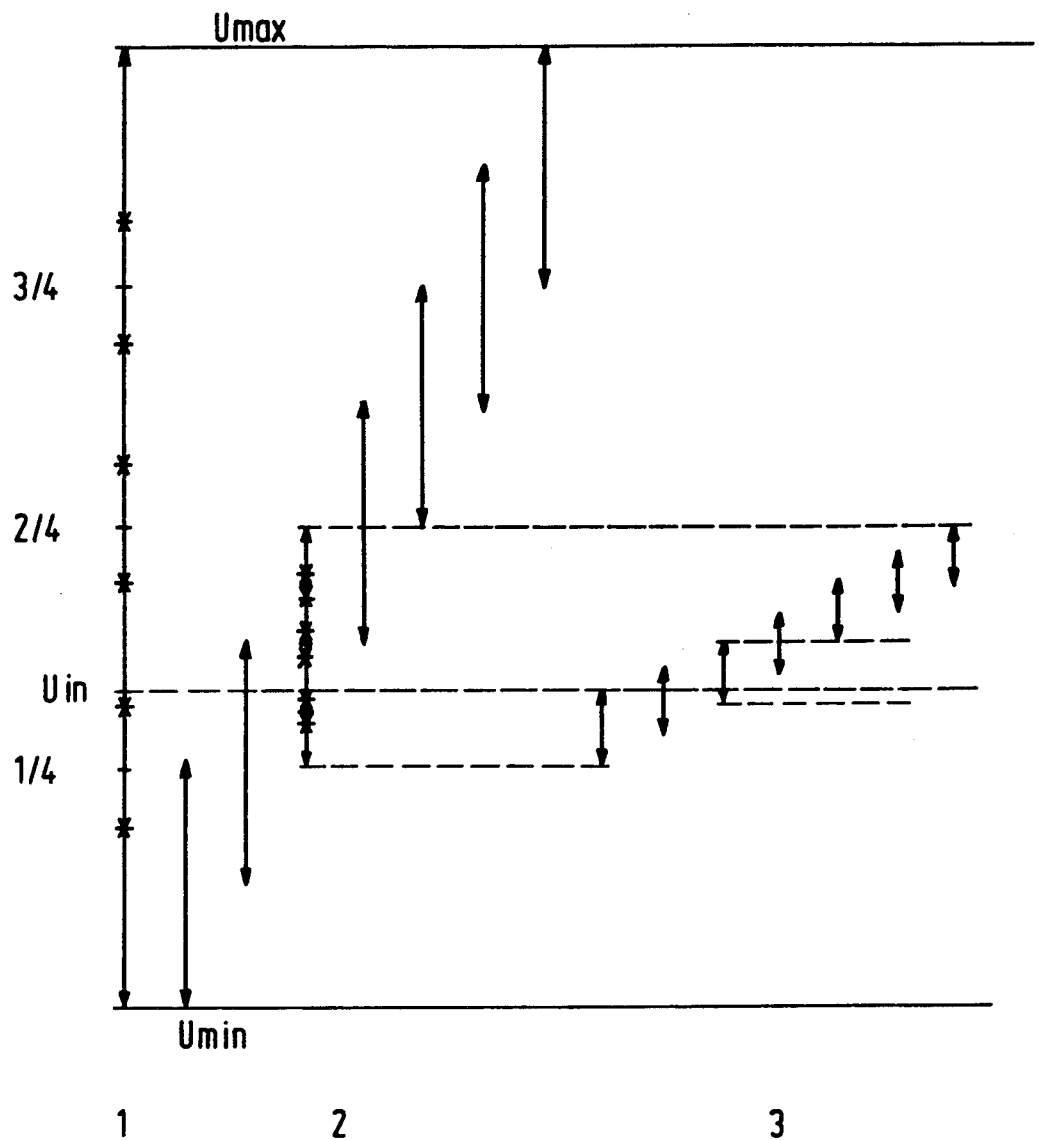

In order to determine the value of one bit of the output signal in a conversion step two comparisons are needed for reference signal values situated at opposite sides of the analog values related to the bits to be determined, which values are indicated by means of a dash (—) in FIG. 6. These analog values correspond to the reference values Uref1 to Uref5 shown in FIG. 2, the values marked with an asterisk (*) and a dash (—) in the fourth and the fifth conversion steps in FIG. 6 coinciding with each other. It is found that if in one conversion step k bits are determined simultaneously $2*(2^k-1)$ comparisons are made, either serially or parallel, at an equal number of reference levels which divide the fraction into $2*(2^k-1)+1$ sub-ranges. In the parallel concept the resolution of the parallel ADC should be adapted to the required number of sub-ranges. FIG. 7 by way of example gives the first two conversion steps of a converter in accordance with the invention, 2 bits of the output signal being determined in every conversion step. In the serial concept the reference values marked with an asterisk (*) are generated in $2*(2^2-1)=6$ intermediate steps and are compared with the input signal by the comparator. In the parallel concept the two extreme values of the fractions indicated by means of the arrows are generated in every conversion step. A parallel ADC comprising 6 comparators and having a 3-bit resolution yields a comparison signal which indicates in which of the 7 sub-ranges the input signal is situated.

Figure 8:
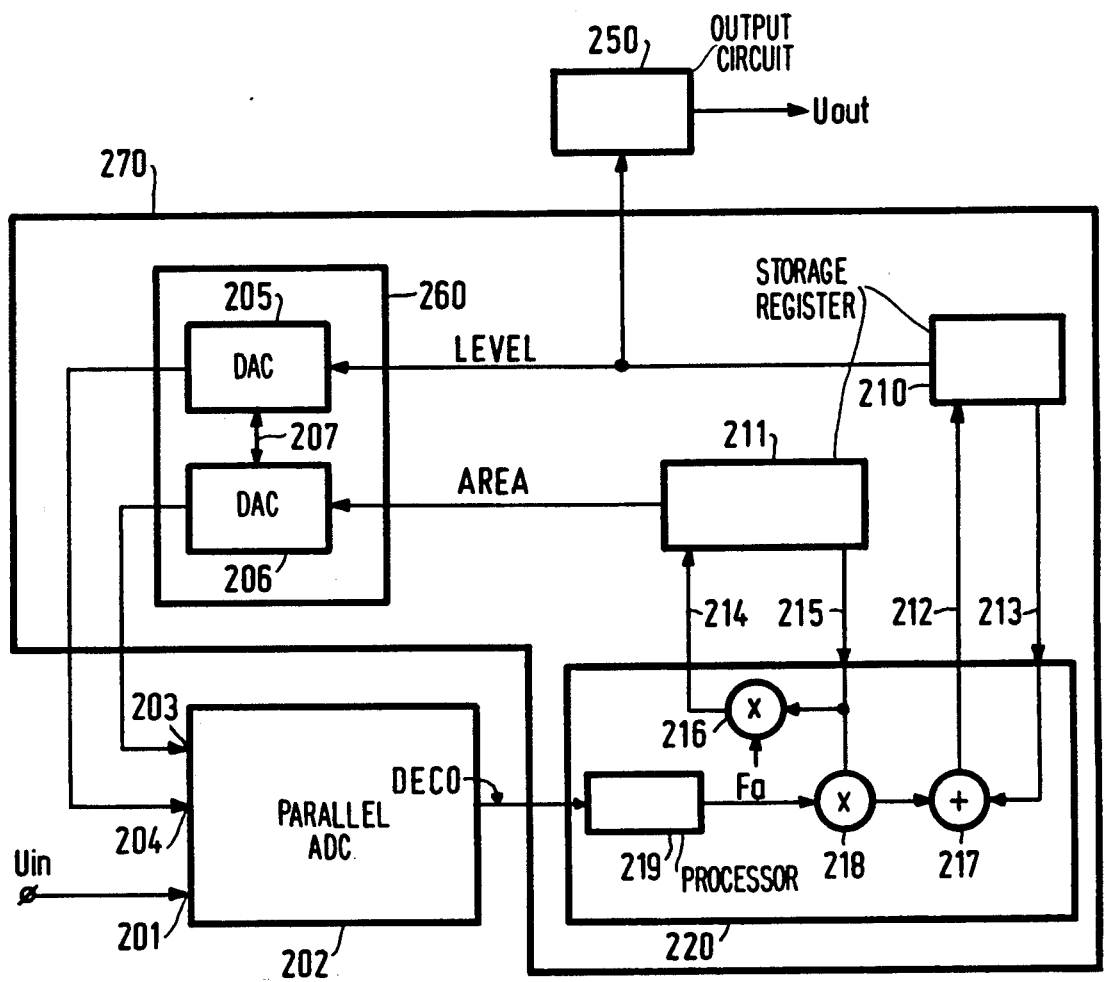
FIG. 8 is a block diagram of an embodiment of an analog-to-digital converter in accordance with the invention operating in conformity with the parallel concept.

FIG. 8 is a block diagram of a converter in accordance with the invention employing the parallel concept. The input signal Uin is applied to the input 201 of a parallel ADC 202 having inputs 203 and 204 for receiving analog reference signals from two DACs 206 and 205 respectively, which are coupled to one another via a coupling 207. A level signal LEVEL stored in a storage register 210 is applied to the DAC 205. The DAC 206 receives a fraction signal AREA which is stored in a storage register 211. The contents of the registers 210, 211 can be changed with the aid of the adaptation means 220 via the supply means 212, 213 and 214, 215 respectively. The contents of the register 211 (AREA) can be adapted by an adaptation factor Fa with the aid of a multiplier 216. The contents of the register 210 (LEVEL) can be incremented with the adder stage 217 by a signal obtained by multiplying in the multiplier 218 the fraction signal AREA from the register 211 by a comparison signal DECO which is received from the parallel ADC 202 and which has been multiplied by a weighting factor in the processing unit 219. The contents of the register 210 is also applied to output means 250 for supplying the digital output signal Uout. The DACs 205 and 206 together constitute conversion means 260 which, together with the storage registers 210 and 211 and the adaptation means 220, form a part of generator means 270.

For every conversion step t a value $AREA_t$ and $LEVEL_t$ is determined by adaptation means 220. Together the values $AREA_t$ and $LEVEL_t$ define a fraction of the input signal range. The centre of the fraction is marked by $LEVEL_t$ and the span of the fraction is marked $AREA_t$. A coupling 207 between the DACs 205 and 206 ensures that the values of $AREA_t$ and $LEVEL_t$ are converted into the limit values of the fraction. These limit values function as reference values on the inputs 203 and 204 of the parallel ADC 202. This ADC determines in which sub-range the input signal Uin is situated and transfers this information to the processing means 219 as the value DECO. In the adaptation means 220 new values $AREA_{t+1}$ and $LEVEL_{t+1}$ are computed on the basis of the value of $DECO_t$ and are stored in the registers 211 and 210, respectively for the next conversion step. $LEVEL_t$ is an absolute value which in the first conversion step is situated halfway the overall input signal range (Umax-Umin). $AREA_t$ is each time reduced by an adaptation factor Fa, Fa being a value between 0 and 1. $AREA_t$ is a relative value, which in the first conversion step is equal to the overall input signal range (Umax-Umin). By means of a value ranging from 0 to n the signal $DECO_t$ indicates in which of the n+1 sub-ranges the input signal is situated. Adaptation of $LEVEL_t$ and $AREA_t$ for the next conversion step proceeds as follows:

$$AREA_{t+1}=Fa*AREA_t \qquad (1)$$

$$LEVEL_{t+1}=LEVEL_t+AREA_t*(DECO_t-\tfrac{1}{2}*n)/(n+2) \qquad (2)$$

In FIG. 6 Fa=$\tfrac{1}{2}$, n=2 and in FIG. 7 Fa=$\tfrac{1}{4}$, n=6.

Figure 9:
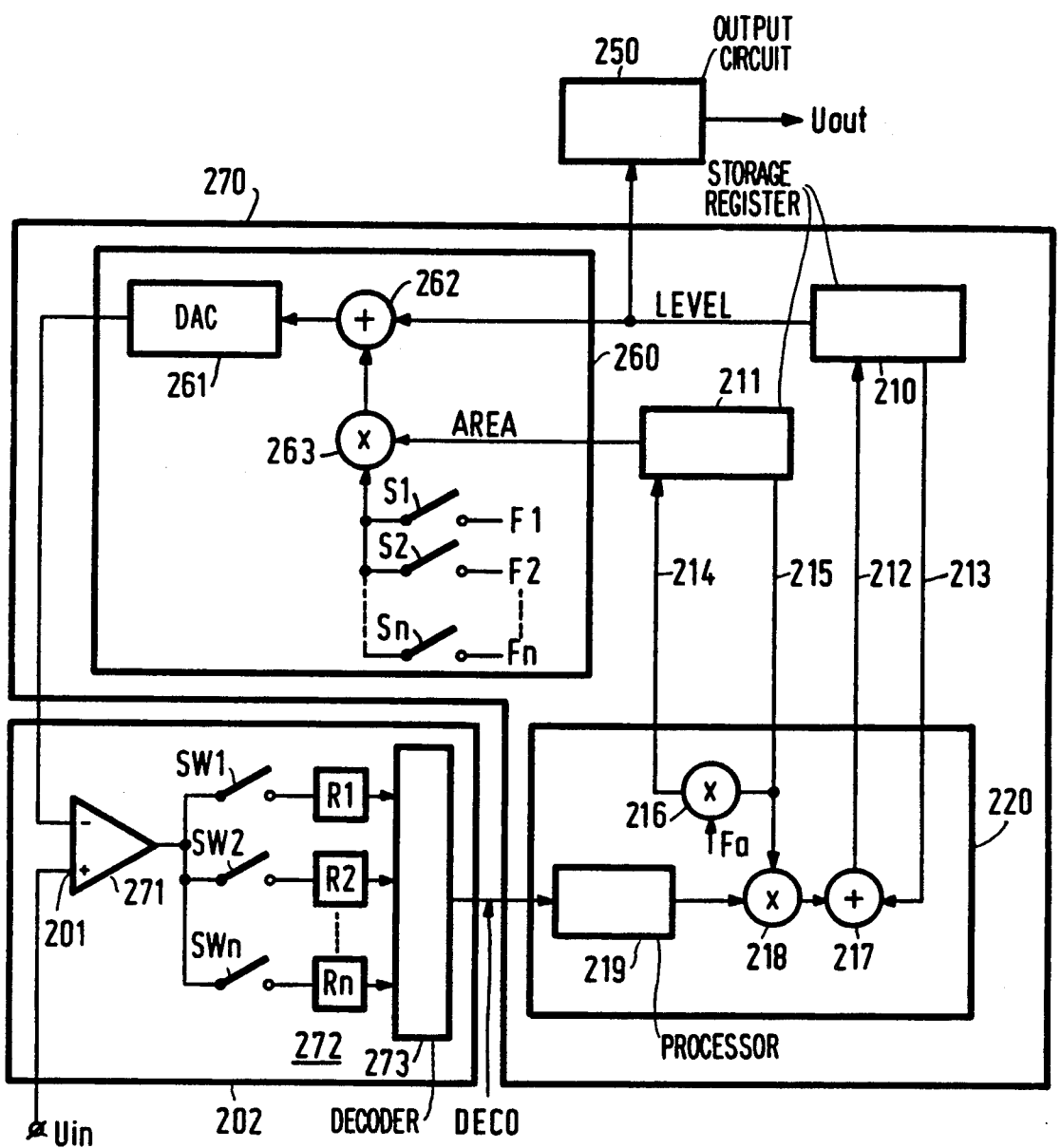
FIGS. 9 and 10 are block diagrams of embodiments of analog-to-digital converters in accordance with the invention operating in conformity with the serial concept.

FIG. 9 shows the general block diagram of a converter in accordance with the invention operating in conformity with the serial concept. In this Figure parts which are identical to those in FIG. 8 bear corresponding reference numerals. The conversion means 260 now comprise one DAC 261 which receives the summed output an adder stage 262. The adder stage adds the value of the level signal LEVEL from the register 210 with a product signal from a multiplier 263. The product signal is obtained by multiplying the fraction signal AREA by a coefficient F1, F2, ..., Fn which is modified in n intermediate steps between the values $+\tfrac{1}{2}$ and $-\tfrac{1}{2}$ within a conversion step. This can be achieved, for example, by connecting the relevant input of the multiplier 263 to signal sources producing signals corresponding to F1, F2, ..., Fn via switches S1, S2, ..., Sn. In the n intermediate steps the DAC 261 generates reference signals which are centred about the value of LEVEL. The comparison means 202 comprise a comparator 271, and in the intermediate steps n switches SW1, SW2, ..., SWn each time connect the output of said comparator to one of n registers R1, R2, ..., Rn of storage means 272 for the storage of the values of the output signal of the comparator 271. On the basis of the contents of the registers of the storage means 272 a decoder 273 generates a comparison signal DECO whose value, which ranges from 0 to n, indicates in which of the n+1 sub-ranges the input signal Uin is situated. Adaptation of LEVEL and AREA further proceeds in the same way as defined by means of formulas (1) and (2), while during a conversion step t a signal $DAC_t$ is applied from the adder stage 262 to DAC 261, which signal in every intermediate step varies in accordance with:

$$DAC_{t,i}=LEVEL_t+Fi*AREA_t \qquad (3)$$

where i=1, 2, ..., n.

Figure 10:
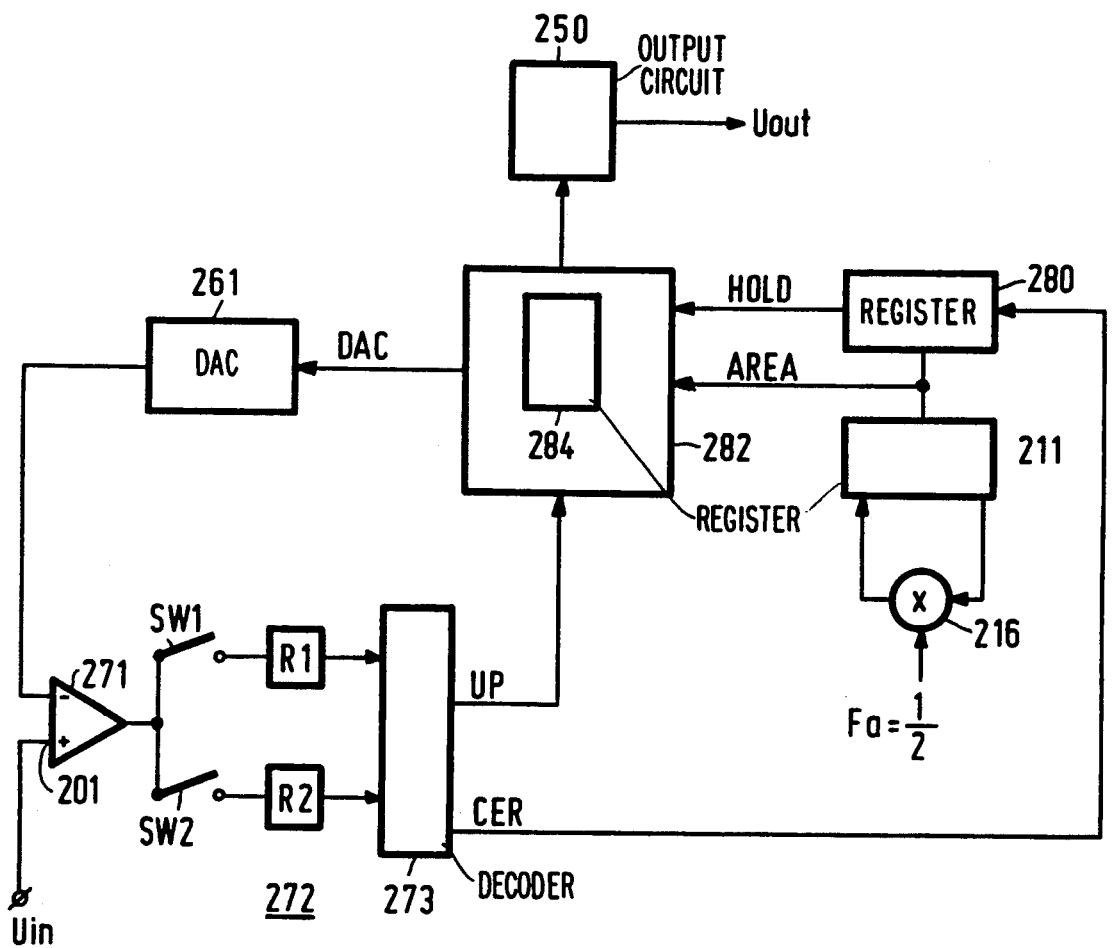

The block diagram of a special embodiment of a converter in accordance with the invention using the serial concept is given in FIG. 10, in which like parts bear the same reference numerals as in FIG. 9. For n the value 2 is selected, yielding n+1=3 sub-ranges in every conversion step. The adaptation factor Fa is $\tfrac{1}{2}$ so that a new fraction is each time equal to half the prior fraction. The register 210 for the storage of the value LEVEL is replaced by a register 280 for the storage of a signal HOLD. HOLD indicates which bits have been determined definitively and should not be altered. The value of the definitively determined bits are stored as a signal REGLOG in a register 284 of a logic processing unit 282, which also derives a signal DAC for the digital-to-analog converter 261 from the values of HOLD and AREA. The coefficients F1 and F2 have the values $-\tfrac{1}{8}$ and $+\tfrac{1}{8}$ and are also generated by the logic processing unit 282. The coefficient $\tfrac{1}{8}$ can be obtained simply by shifting the binary number AREA three bit positions to the right. The + or − sign can be obtained by inversion (ones complement) of the shifted number AREA. In that case the actual value of the coefficient $+\tfrac{1}{8}$ will be one LSB smaller. The decoder 273 generates two signals on the basis of the contents of the two registers R1 and R2 of the storage means 272. One signal CER signals to the register 280 which bits have been determined definitively. The other signal UP signals to the logic processing unit 282 whether the coefficient $+\frac{1}{8}$ or $-\frac{1}{8}$ should be selected. If t is the sequence number of the conversion step and i is the sequence number of the intermediate step (i=0 or i=1), the logic operations of the system may be written as follows:

$$DAC_{t+1,j} = REGLOG_{t+1} * HOLD_{t+1} + NOT(HOLD_{t+1}) * \\ *(UP_i XOR(AREA_{t+1} >>> * NOT(HOLD_{t+1}) >)) \quad (4)$$

$$AREA_{t+1} = AREA_t > \quad (5)$$

$$UP_i = R1 * i \quad (6)$$

$$CER_t = NOT(R1) + R2 \quad (7)$$

$$HOLD_{t+1} = NOT(CER_t) * HOLD_t + CER_t * AREA_t \quad (8)$$

Herein:
- > means shift one bit position to the right (divide by 2)
- XOR represents the logic exclusive OR-function
- NOT denotes the logic inversion function.

By way of illustration the contents of the registers of a 16-bit system is given at the beginning and the end of a conversion of an input signal whose value is close to the MSB. The initial values are as follows:

| | |
|---|---|
| $AREA_0$ | = 0000000000000000 |
| $NOT(HOLD_0)$ | = 1111111111111111 |
| $REGLOG_0$ | = xxxxxxxxxxxxxxxx |
| $UP_0$ | = 0 |
| $UP_1$ | = 1 |
| $CER_0$ | = 1 |
| $AREA_0 >>>$ | = 1110000000000000 |
| $NOT(HOLD_0) >$ | = 0111111111111111 |
| $DAC_{0,0}$ | = 0110000000000000 |
| $DAC_{0,1}$ | = 1001111111111111 |

Since the input signal is situated close to MSB the contents of the registers after 15 conversion steps will be as follows:

| | |
|---|---|
| $AREA_{15}$ | = 1111111111111110 |
| $NOT(HOLD_{15})$ | = 1111111111111111 |
| $REGLOG_{15}$ | = xxxxxxxxxxxxxxxx |
| $UP_0$ | = 0 |
| $UP_1$ | = 1 |
| $CER_{15}$ | = 0 |
| $AREA_{15} >>>$ | = 1111111111111111 |
| $NOT(HOLD_{15}) >$ | = 0111111111111111 |
| $DAC_{15,0}$ | = 0111111111111111 |
| $DAC_{15,1}$ | = 1000000000000000 |

It is found that the value of HOLD has not changed and that all the bits of REGLOG are still indeterminate. It is not possible to determine all the bits definitively until the last conversion step. This may result in two different final values depending on the exact situation of the input signal Uin relative to the centre of the overall range given by MSB. If Uin is situated below the centre the final values are as follows:

| | |
|---|---|
| $AREA_{16}$ | = 1111111111111111 |
| $NOT(HOLD_{16})$ | = 0000000000000000 |
| $REGLOG_{16}$ | = 0111111111111111 |
| $UP_0$ | = 0 |
| $UP_1$ | = 0 |
| $CER_{16}$ | = 1 |
| $AREA_{16} >>>$ | = 1111111111111111 |
| $NOT(HOLD_{16}) >$ | = 0000000000000000 |
| $DAC_{16,0}$ | = 0111111111111111 |
| $DAC_{16,1}$ | = 0111111111111111 |

If Uin is situated above the centre the same values apply except for:

| | |
|---|---|
| $UP_1$ | = 1 |
| $DAC_{16,1}$ | = 1000000000000000 |

The invention is not limited to the embodiments described herein. Within the scope of the invention various modifications of the parallel and serial concept are conceivable, a combination of the two concepts also being possible.

We claim:

1. An analog-to-digital converter for converting an analog input signal into a digital output signal in a series of successive conversion steps, comprising:
   comparison means for comparing, in a plurality of conversion steps, the analog input signal with at least two reference signals defining at least three sub-ranges of a fraction of an input-signal range,
   output means for generating the digital output signal as a function of comparison signals generated by the comparison means in the successive conversion steps,
   generator means for generating as a function of the comparison signal generated in a conversion step new reference signals for the next conversion step, the new reference signals defining a new fraction of the input signal range for the next conversion step, which new fraction overlaps at both sides one of the sub-ranges of a relevant conversion step.

2. An analog-to-digital converter as claimed in claim 1, wherein the generator means comprise:
   first storage means for storing a fraction signal corresponding to the magnitude of the fraction,
   second storage means for storing a level signal which is at least partly determined by the fraction,
   conversion means for converting the fraction signal and the level signal into the reference signals, and
   adaptation means for adjusting the fraction signal and the level signal to the next conversion step as a function of the comparison signal of a relevant conversion step.

3. An analog-to-digital converter as claimed in claim 2, wherein the adaptation means comprise:
   first supply means for supplying to the first storage means, upon completion of a conversion step, the fraction signal multiplied by an adaptation factor,
   second supply means for supplying to the second storage means, upon completion of the conversion step, a sum signal equal to the sum of the level signal and the fraction signal multiplied by the product of the comparison signal and a weighting factor, $S = L + F(CW)$, where S is the sum signal, L is the level signal, F is the fraction signal, C is the comparison signal and W is the weighting factor.

4. An analog-to-digital converter as claimed in claim 3, wherein the conversion means comprise:
   a first and a second digital-to-analog converter for converting the fraction signal, and the level signal into an analog window signal and an analog shift signal respectively, and wherein the comparison means comprise:
a parallel analog-to-digital converter for converting a range of the analog input signal, which range is defined by the window signal and the shift signal, into the comparison signal.

5. An analog-to-digital converter as claimed in claim 3, wherein the conversion means comprise:
multiplication means for multiplying the fraction signal by a coefficient to generate a product signal in a predetermined number of successive intermediate steps during the conversion step,
adding means for forming the sum of the level signal and the product signal so as to obtain a sum signal, and
a digital-to-analog converter for converting the sum signal into the reference signal,
and wherein the comparison means comprise:
a comparator for comparing the analog input signal with the reference signal,
third storage means for storing successive values of a decision signal generated by the comparator in the intermediate steps and decoder means for decoding the values of the decision signal to form the comparison signal.

6. An analog-to-digital converter as claimed in claim 2, wherein the conversion means comprise:
a first and a second digital-to-analog converter for converting the fraction signal and the level signal into an analog window signal and an analog shift signal, respectively, and wherein the comparison means comprise:
a parallel analog-to-digital converter for converting a range of the analog input signal, which range is defined by the window signal and the shift signal, into the comparison signal.

7. An analog-to-digital converter as claimed in claim 2, wherein the conversion means comprise:
multiplication means for multiplying the fraction signal by a coefficient to generate a product signal in a predetermined number of successive intermediate steps during the conversion step,
adding means for forming the sum of the level signal and the product signal so as to obtain a sum signal, and
a digital-to-analog converter for converting the sum signal into the reference signal, and wherein the comparison means comprise:
a comparator for comparing the analog input signal with the reference signal,
third storage means for storing successive values of a decision signal generated by the comparator in the intermediate steps, and decoder means for decoding the values of the decision signal to form the comparison signal.

8. A successive approximation type of analog-to-digital converter comprising:
an input terminal for receiving an analog input signal to be converted into a digital output signal in a series of successive conversion steps,
comparison means coupled to said input terminal for comparing, in a plurality of successive conversion steps, the analog input signal with at least two analog reference signals which define at least three sub-ranges of a fraction of an input signal range, whereby said comparison means produces comparison signals at its output,
generator means coupled to the output of said comparison means and responsive to a comparison signal produced in one conversion step for generating two new analog reference signals for a next conversion step, said two new analog reference signals defining a new smaller fraction of the input signal range for said next conversion step, said new fraction overlapping one sub-range of said one conversion step, said generator means including a digital storage device controlled by the output of said comparison means and a digital-to-analog converter responsive to digital reference signals received from the digital storage device, an output of said digital-to-analog converter being coupled to a second input of the comparison means for supplying thereto said two analog reference signals, and
output means coupled to said digital storage device for producing said digital output signal at the end of said series of successive conversion steps.

9. An analog-to-digital converter as claimed in claim 8, wherein said two new reference signals produced by the generator means in a next conversion step define three new sub-ranges of the new fraction wherein at least one of said three new sub-ranges is smaller than at least one other of the three new sub-ranges.

10. An analog-to-digital converter as claimed in claim 9, wherein the two end sub-ranges of the new fraction are equal and said one smaller sub-range is intermediate the two equal end sub-ranges.

11. An analog-to-digital converter as claimed in claim 8, wherein said generator means is arranged to produce, as a function of the comparison signal, in said next conversion step any one of three possible fractions which overlap one another and each of which is divided into three sub-ranges by the two new analog reference signals generated by the generator means.

12. An analog-to-digital converter as claimed in claim 8, wherein said digital storage device of the generator means comprises first and second digital storage means for storing a fraction signal and a level signal, respectively, said generator means further comprising,
conversion means responsive to said fraction signal and to said level signal for converting same into said reference signals, and
adaptation means coupled to said comparison means and to said first and second digital storage means for adjusting the fraction signal and the level signal of a next conversion step as a function of the comparison signal produced in said one conversion step.

13. An analog-to-digital converter as claimed in claim 12, wherein said adaptation means comprises,
a first multiplier having first and second inputs coupled to the output of the first digital storage means and to an adaptation factor signal and an output for supplying to said first digital storage means, upon completion of a conversion step, a signal equal to the product of the fraction signal and the adaptation factor signal,
an adder having a first input coupled to an output of the second digital storage means and an output coupled to an input of the second digital storage means,
a second multiplier having a first input that receives a first signal equal to the product of the comparison signal (C) and a weighting factor signal (W) and a second input which receives the fraction signal (F) from the first storage means, and means coupling an output of the second multiplier to a second input of the adder whereby the adder produces at its output at the end of a conversion step a sum signal (S) where S=L+L (CW), wherein F is a level signal.

14. An analog-to-digital converter as claimed in claim 12, wherein said conversion means comprise, first and second digital-to-analog converters coupled to said first and second digital storage means, respectively, and responsive to said fraction signal and to said level signal, respectively, and said comparison means comprise a parallel analog-to-digital converter coupled to outputs of said first and second digital-to-analog converters and to said input terminal.

* * * * *